(12) United States Patent
Chen

(10) Patent No.: US 8,950,593 B2
(45) Date of Patent: Feb. 10, 2015

(54) STRUCTURE FOR MOUNTING A DEVICE ON A RACK

(75) Inventor: Jih-Ming Chen, Shijr (TW)

(73) Assignee: Aten International Co., Ltd., Shijr (TW)

( * ) Notice: Subject to any disclaimer, the term of this patent is extended or adjusted under 35 U.S.C. 154(b) by 434 days.

(21) Appl. No.: 13/235,286

(22) Filed: Sep. 16, 2011

(65) Prior Publication Data

US 2013/0068706 A1    Mar. 21, 2013

(30) Foreign Application Priority Data

May 24, 2011 (TW) .............................. 100118098 A

(51) Int. Cl.
  *A47F 7/00*  (2006.01)
  *H05K 7/14*  (2006.01)
  *H05K 7/16*  (2006.01)
  *A47B 88/00* (2006.01)
(52) U.S. Cl.
  CPC .................................. *H05K 7/1489* (2013.01)
  USPC ........................... 211/26; 361/727; 312/334.1
(58) Field of Classification Search
  CPC . H05K 7/1447; H05K 7/1448; H05K 7/1489; H05K 7/1491; H05K 7/1492; H05K 7/1494; H02B 1/36; G06F 1/18
  USPC ........ 211/26; 312/334.5, 334.1, 334.4, 334.7, 312/223.2; 361/725, 727, 826, 827
  See application file for complete search history.

(56) References Cited

U.S. PATENT DOCUMENTS

| | | | |
|---|---|---|---|
| 6,442,030 B1 * | 8/2002 | Mammoser et al. .......... | 361/727 |
| 6,442,031 B1 * | 8/2002 | Liu ............................... | 361/727 |
| 6,578,939 B1 * | 6/2003 | Mayer ......................... | 312/334.5 |
| 6,600,665 B2 | 7/2003 | Lauchner | |
| 7,187,554 B2 * | 3/2007 | Seki et al. ..................... | 361/727 |
| 7,258,568 B2 * | 8/2007 | Shih .............................. | 439/377 |

(Continued)

FOREIGN PATENT DOCUMENTS

| | | |
|---|---|---|
| CN | 2519593 | 10/2002 |
| CN | 2585532 | 11/2003 |

(Continued)

OTHER PUBLICATIONS

Taiwanese Office Action, dated May 13, 2013, in a counterpart Taiwanese patent application, No. TW 100118098.

(Continued)

*Primary Examiner* — Patrick Hawn
(74) *Attorney, Agent, or Firm* — Chen Yoshimura LLP

(57) ABSTRACT

A mounting structure for mounting two pieces of equipment to a U shaped support arm structure of an equipment rack. The mounting structure includes an affixing structure supported by the support arm structure and a positioning structure affixed to the affixing structure at an adjustable position to define an adjustable size of the mounting structure. The first piece of equipment (e.g. a monitor) is mounted on the support arm structure, and is fixedly connected to one end of the mounting structure. The second piece of equipment (e.g. a KVM switch) is supported by the affixing structure. The positioning structure is fixedly connecting to the second piece of equipment near the other end of the mounting structure. Horizontal and vertical calibration devices help align the two pieces of equipment to enable two connectors of the two pieces of equipment to directly connect with each other without using a cable.

10 Claims, 17 Drawing Sheets

(56) References Cited

U.S. PATENT DOCUMENTS

| | | | |
|---|---|---|---|
| 7,405,926 B2 * | 7/2008 | Wu et al. | 361/679.27 |
| 7,633,760 B2 * | 12/2009 | Wu et al. | 361/727 |
| 7,808,795 B2 * | 10/2010 | Lu | 361/727 |
| 2005/0035262 A1 * | 2/2005 | Seki et al. | 248/441.1 |
| 2006/0289370 A1 * | 12/2006 | Shih | 211/26 |
| 2008/0074349 A1 | 3/2008 | Hong | |
| 2008/0284300 A1 * | 11/2008 | Wu et al. | 312/334.1 |

FOREIGN PATENT DOCUMENTS

| | | |
|---|---|---|
| CN | 101150942 | 3/2008 |
| CN | 201159868 | 12/2008 |
| TW | M338541 | 8/2008 |

OTHER PUBLICATIONS

Chinese Office Action, dated Feb. 24, 2014, in a counterpart Chinese patent application, No. CN 201110230340.X.

* cited by examiner

STRUCTURE FOR MOUNTING A DEVICE ON A RACK

BACKGROUND OF THE INVENTION

1. Field of the Invention

This invention relates to a mounting structure and an equipment rack using such a mounting structure, and in particular, it relates to such a mounting structure and equipment rack for mounting a keyboard-video-mouse (KVM) switch.

2. Description of the Related Art

With the increased reliance on computer equipment, the requirements for server equipment and their computing and storage capabilities are increasing. This increases the demand for efficiently accommodate the computer equipment in offices, manufacturing locations, etc. Due to the functional requirements and reliability requirements, servers typically are larger than desktop computers. Management and space allocation for servers, including wiring arrangement, are therefore important. A typical company will have anywhere from a few to thousands of servers. Thus, management and efficient space utilization will become more and more important as the number of servers increases.

Typically, servers are mounted racks, such as rack 20 shown in FIGS. 1A and 1B. Conventional server rack 20 typically use cables 40 to connect multiple pieces of equipment, such as equipment 71, 72 shown in FIGS. 1A and 1B. Because the rack typically has a fixed size, when the sizes of the equipment 71, 72 change, they often cannot use the original rack. As shown in FIG. 1B, when the depth of the rack 20 is smaller than the size of the equipment 71, 72 in the depth direction, if they are to be connected by the cable 40, it may result in difficulties or instability in mounting the equipment 72 in the rare.

SUMMARY OF THE INVENTION

Accordingly, an object of the present invention is to provide a mounting structure for mounting computer equipment on racks, which allows for adjustable depth of the mounting structure to suit the sizes of the equipment being mounted.

An object of the present invention is to provide a rack structure for mounting equipment, which allows for adjustment of the space needed depending on the sizes of the equipment being mounted.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a mounting structure for mounting a piece of equipment, which includes an affixing structure and a positioning structure. The affixing structure includes a plate having a first face and a second face opposite the first face, a first fin disposed across a support arm body along a first side face of the plate and extending in a facing direction of the first face, a second fin for supporting the piece of equipment, disposed along a second side face of the plate parallel to the first side face and extending in a facing direction of the second face, and a plate mounting member disposed at one end of the plate. The positioning structure is disposed at an adjustable position along the affixing structure to define an adjustable size of the mounting structure, the positioning structure including an equipment mounting member located near another end of the plate.

The affixing structure further includes a guiding member; and the positioning structure further includes: a positioning plate having a guiding slot, wherein the guiding member is slidable along the guiding slot, and a locking member for locking the positioning structure with respect to the affixing structure.

The plate mounting member or the equipment mounting member includes a bore hole.

In another aspect, the present invention provides a rack for mounting a first and a second piece of equipment, which includes: at least one support post; a U shaped support arm, and a mounting structure. The U shaped support arm includes a first support arm body, an end unit, and a second support arm body, wherein the end unit is adapted for mounting the first piece of equipment. The mounting structure includes an affixing structure and a positioning structure. The affixing structure includes: a plate disposed in parallel with the first support arm body, having a first face and a second face opposite the first face, wherein the second face faces an inside of the U shaped support arm; a first fin disposed across the first support arm body along a first side face of the plate and extending in a facing direction of the first face; a second fin for supporting the second piece of equipment, disposed along a second side face of the plate parallel to the first side face and extending in a facing direction of the second face; and a plate mounting member disposed at one end of the plate for fixedly connecting to the first piece of equipment. The positioning structure is disposed at an adjustable position along the affixing structure to define an adjustable size of the mounting structure, the positioning structure including an equipment mounting member located near another end of the plate for fixedly connecting to the second piece of equipment.

The rack further includes a support structure, which includes: a support plate disposed in parallel with the second support arm body, having a third face and a fourth face opposite the third face, wherein the fourth face faces the inside of the U shaped support arm; a third fin disposed across the second support arm body along a first side face of the support plate and extending in a facing direction of the third face; a fourth fin for supporting the second piece of equipment, disposed along a second side face of the support plate parallel to the first side face and extending in a facing direction of the fourth face; and a support plate mounting member disposed at one end of the support plate for fixedly connecting to the first piece of equipment.

The first piece of equipment has a first connector and the second piece of equipment has a second connector. When the first connector and the second connector are connected to each other, the positioning structure is disposed at a first position along the affixing structure and the mounting structure has a first size, wherein the plate mounting member fixedly connects the affixing structure to the first piece of equipment and the equipment mounting member fixedly connects the positioning structure to the second piece of equipment. The rack further includes a horizontal calibration device and a vertical calibration device, for calibrating horizontal and vertical positions, respectively, of the first and second pieces of equipment relative to each other to enable connection of the first connector and the second connector with each other.

In another aspect, the present invention provides a rack for mounting a first and a second piece of equipment, which includes: a support arm structure on which the first piece of equipment is mounted; and a mounting structure, including: an affixing structure supported by the support arm structure, having a first mounting member disposed at a first end of the mounting structure adapted for fixedly connecting to the first piece of equipment, and a fin for supporting the second piece of equipment; and a positioning structure having a second mounting member disposed near a second end of the mounting structure adapted for fixedly connecting to the second piece of equipment, the positioning structure being affixed to the affixing structure at an adjustable position to define an adjustable size of the mounting structure defined by a distance between the first mounting member and the second mounting member.

It is to be understood that both the foregoing general description and the following detailed description are exemplary and explanatory and are intended to provide further explanation of the invention as claimed.

DETAILED DESCRIPTION OF THE PREFERRED EMBODIMENTS

As required, a detailed illustrative embodiment of the present invention is disclosed herein. However, techniques, systems, operating structures and methods in accordance with the present invention may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein, which define the scope of the present invention. The following presents a detailed description of the preferred embodiment (as well as some alternative embodiments) of the present invention.

Figure 1A:
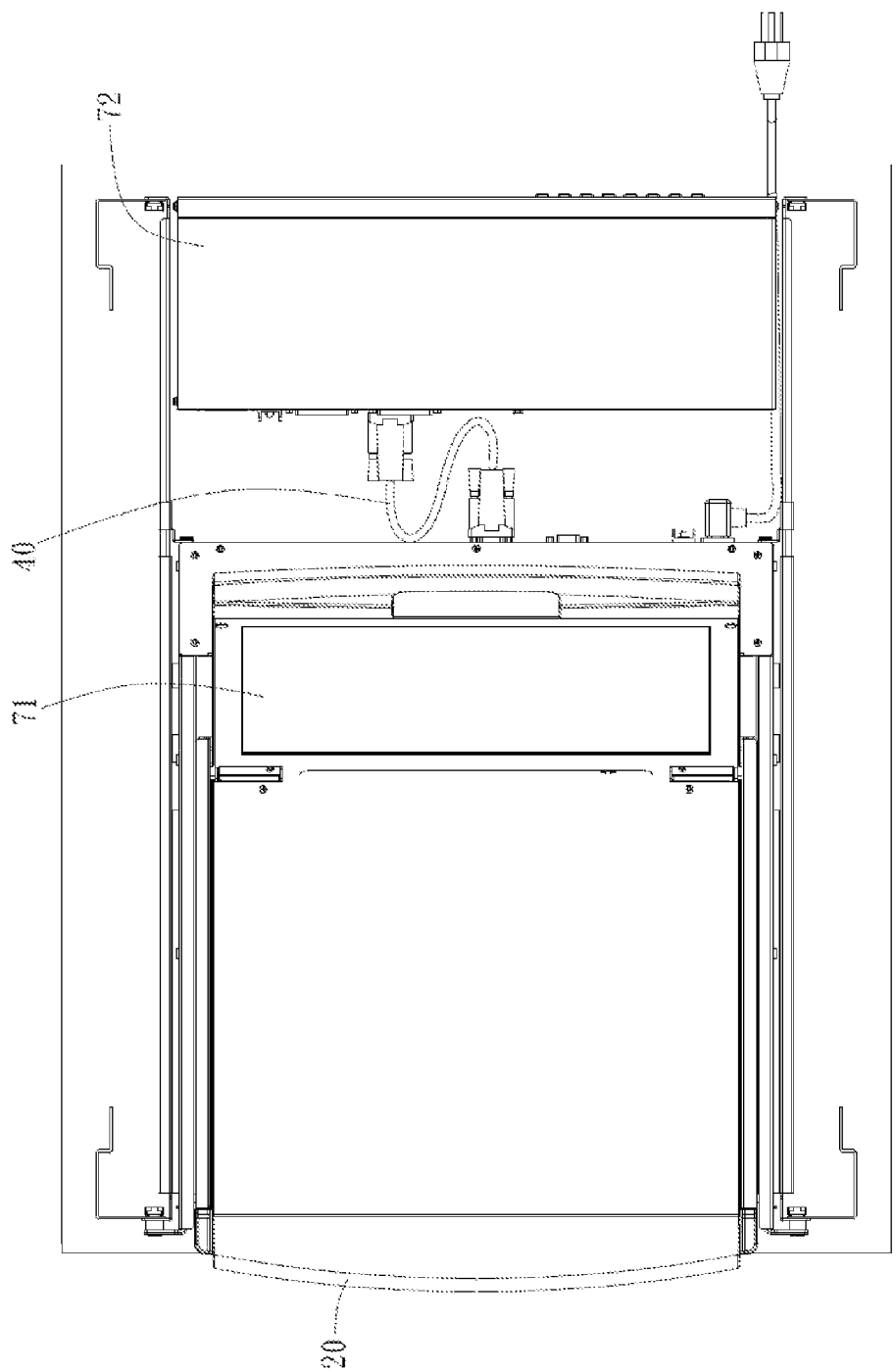
FIGS. 1A and 1B illustrate a conventional rack.
Figure 1B:
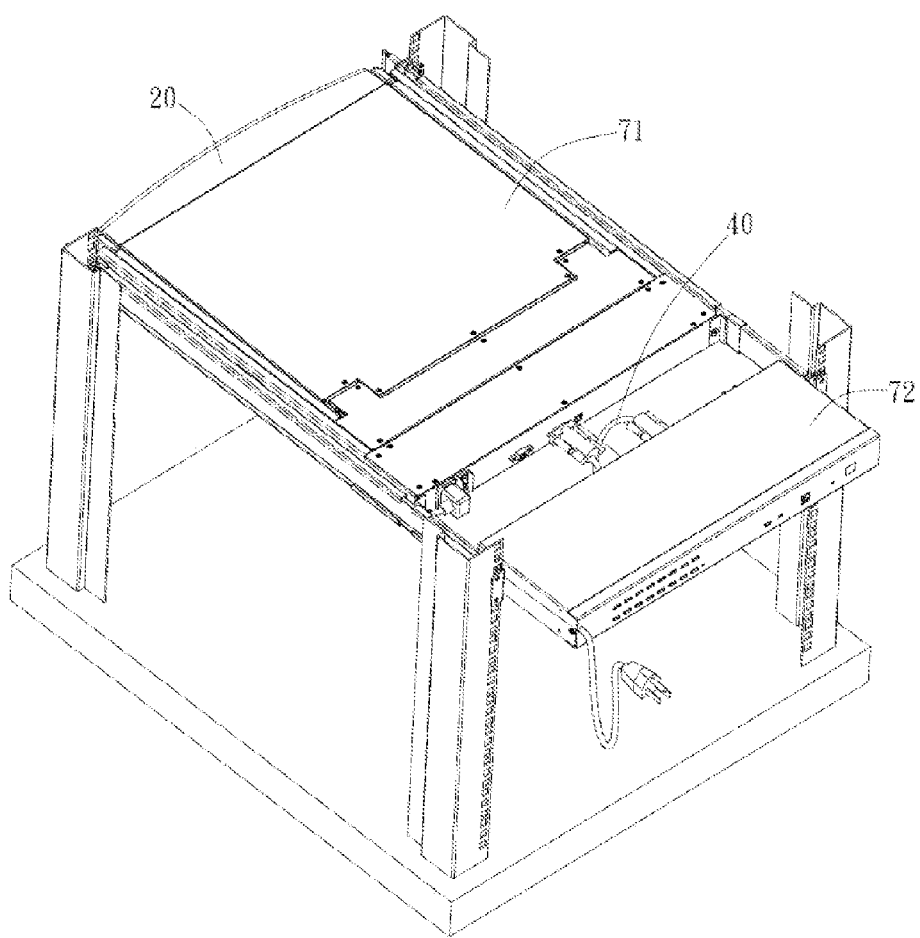
Figure 2:
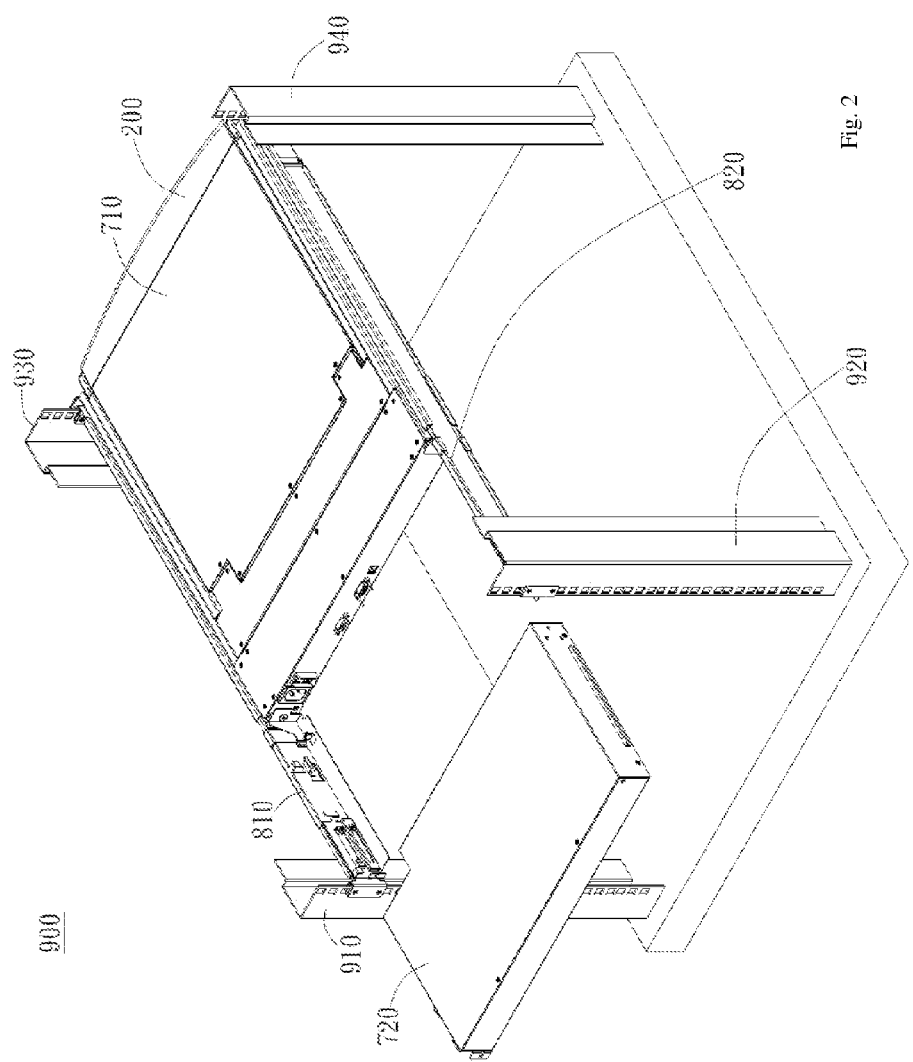
FIG. 2 illustrates a rack and mounting structure according to a preferred embodiment of the present invention.
Figure 4A:
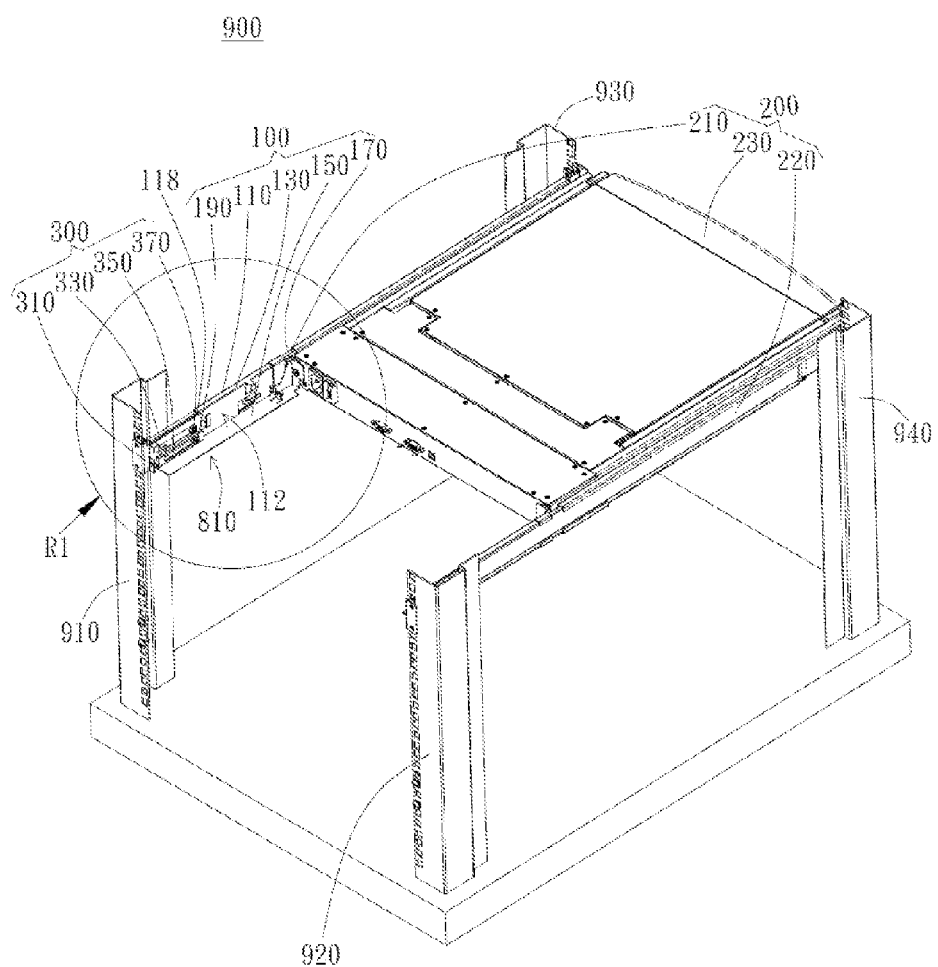
FIG. 4A illustrates the rack and the mounting structure.

Embodiments of the present invention provide a mounting structure for mounting a piece of equipment. In a preferred embodiment, the equipment is a KVM (keyboard-video-mouse) switch, but the invention is applicable to other types of equipment. In a preferred embodiment shown in FIG. 2, a mounting structure 810 and a U shaped support arm 200 form a rack 900, for mounting first and second pieces of equipment 710 and 720. The equipment 710 and 720 may be, for example, a KVM switch and a user console device (monitor, or monitor and keyboard) connected to the KVM switch. As shown in FIG. 4A, the U shaped support arm 200 includes a first support arm body 210, an end unit 230, and a second support arm body 220. The first piece of equipment 710 is fixedly mounted on the end unit 230 of the U shaped support arm 200. The rack 900 includes at least one support post for supporting the mounting structure 810 and the U shaped support arm 200. In the embodiment of FIG. 2, the rack 900 includes four support posts 910, 920, 930, 940 fixed to the four corners of the U shaped support arm 200. In other embodiments, more support posts may be used to enhance the stability of the rack, or fewer support racks may be used to save space.

Figure 3:
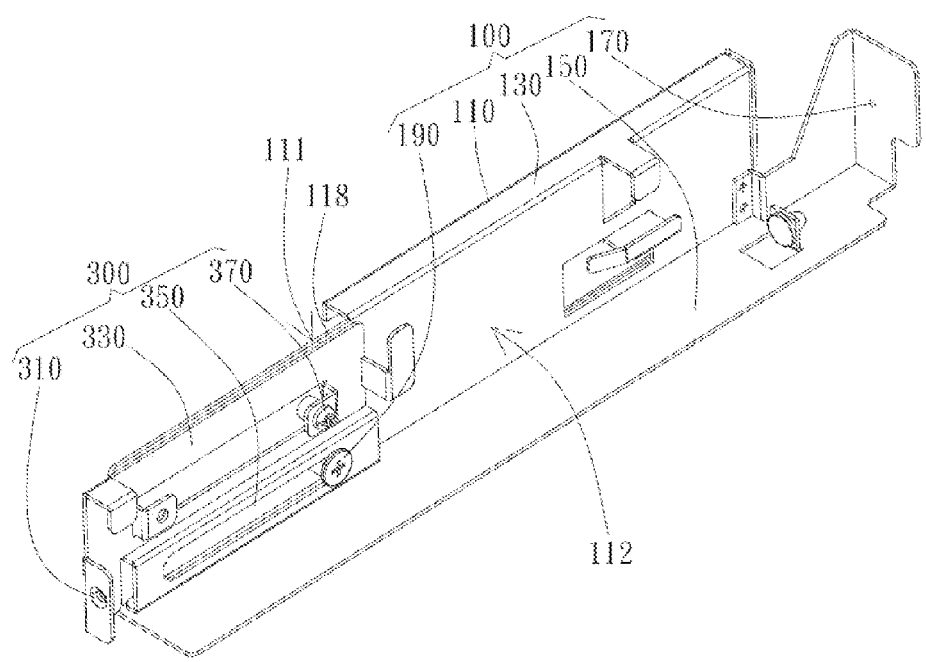
FIG. 3 illustrates a portion of the mounting structure.
Figure 4B:
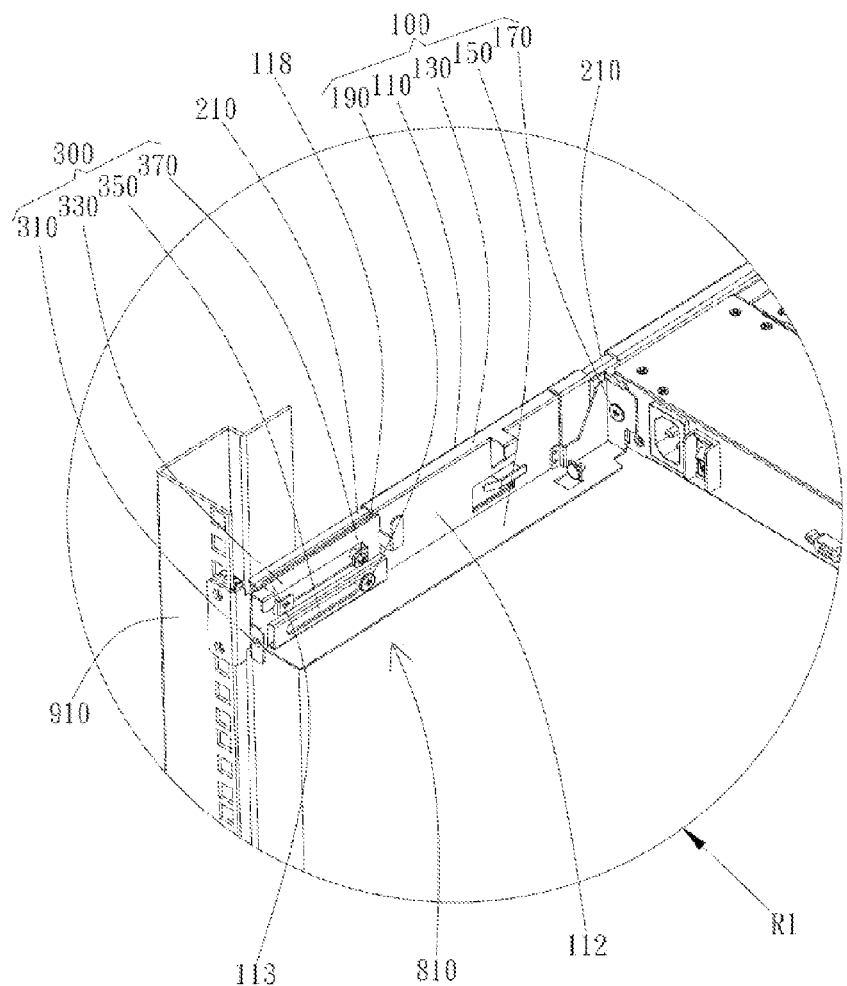
FIG. 4B is an enlarged view of a portion of the mounting structure shown in FIG. 4A.

As shown in FIG. 3, the mounting structure 810 including an affixing structure 100 and a positioning structure 300. The affixing structure 100 includes a plate 110, a first fin 130, a second fin 150 and a plate mounting member 170. The plate 110 has a first face 111 and a second face 112 opposite the first face 111. In other words, the first face 111 and the second face 112 are two opposite sides of the plate 110. As shown in FIG. 4A, the plate 110 is preferably (but not necessarily) parallel to the first support arm body 210; the second face 112 faces the inside of the U shaped support arm 200. An enlarged view of the area R1 of FIG. 4B is shown in FIG. 4B. The first fin 130 is disposed across the first support arm body 210 along a side face 118 of the plate 110, and extends in the facing direction of the first face 111 (see FIG. 3). Preferably, the side face 118 of the plate 110 bends in the facing direction of the first face 111 and extends to form an upside-down flat-bottomed U shape, and the first fin 130 is the top of this upside-down flat-bottomed U shape. When the first fin 130 sits across the first support arm body 210, the top edge of the first support arm body 210 fits into the upside-down flat-bottomed U shape.

Figure 5:
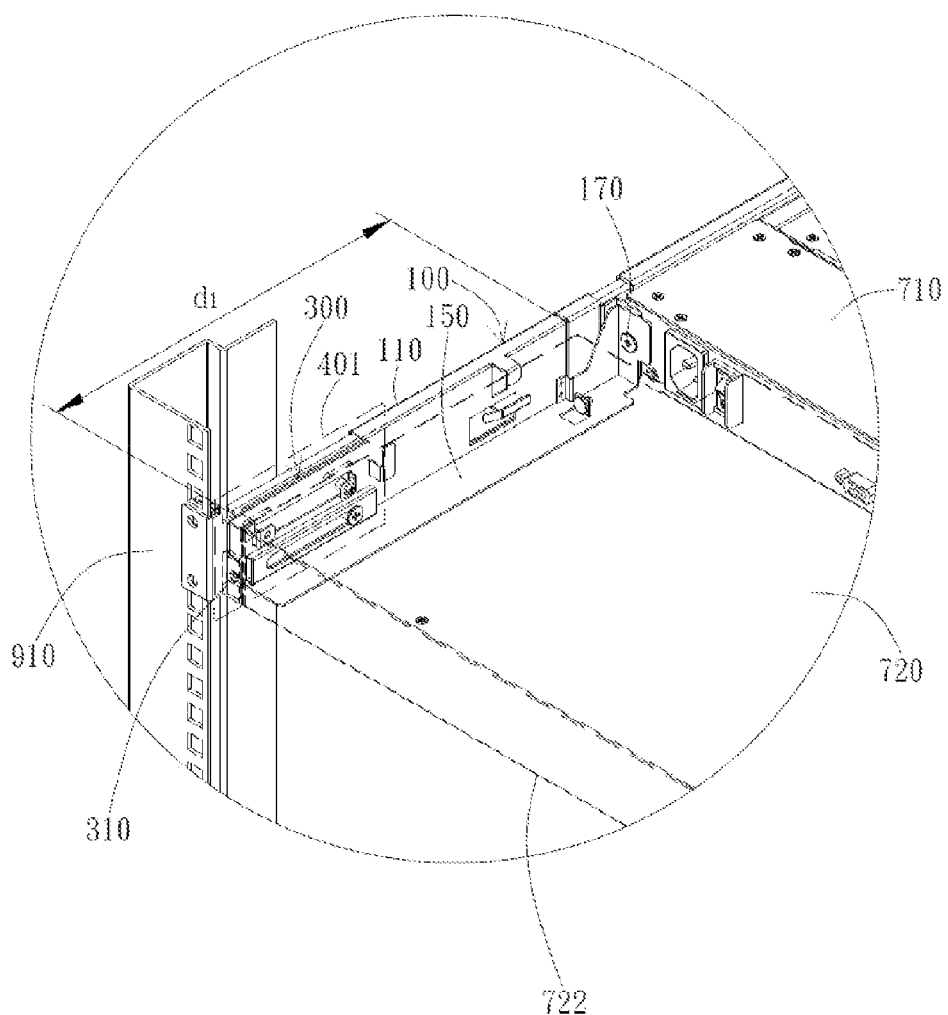
FIG. 5 illustrates the mounting structure when its positioning structure is in a first position.

As shown in FIG. 4B, the second fin 150, which supports the second piece of equipment 720 (see FIG. 2), is disposed along another side face of the plate 110 that is parallel to the side face 118, and extends in the facing direction of the second face 112. The positioning structure 300 is located at a particular position of the plate 110, such that the mounting structure 810 can have different lengths as will be described in more detail later. The positioning structure 300 has an equipment mounting member 310 disposed at another end 113 of the plate 110. Specifically, as shown in FIG. 5, when the second piece of equipment 720 is connected to the first piece of equipment 710, the bottom surface 722 of the second piece of equipment 720 contacts the second fin 150, so that the second fin 150 supports the second piece of equipment 720. The plate mounting member 170 is disposed at the end of the plate 110 close to the first piece of equipment 710, for fixedly connecting the affixing structure 100 to the first piece of equipment 710. The equipment mounting member 310 fixedly connects the positioning structure 300 to the second piece of equipment 720. Preferably, the plate mounting member 170 and the equipment mounting member 310 are provided with a bolt hole to allow a bolt or screw to be screwed into the first and second pieces of equipment 710 and 720, respectively, to fixedly connect the affixing structure 100 and the positioning structure 300 to the first and second pieces of equipment 710 and 720, respectively.

Figure 6A:
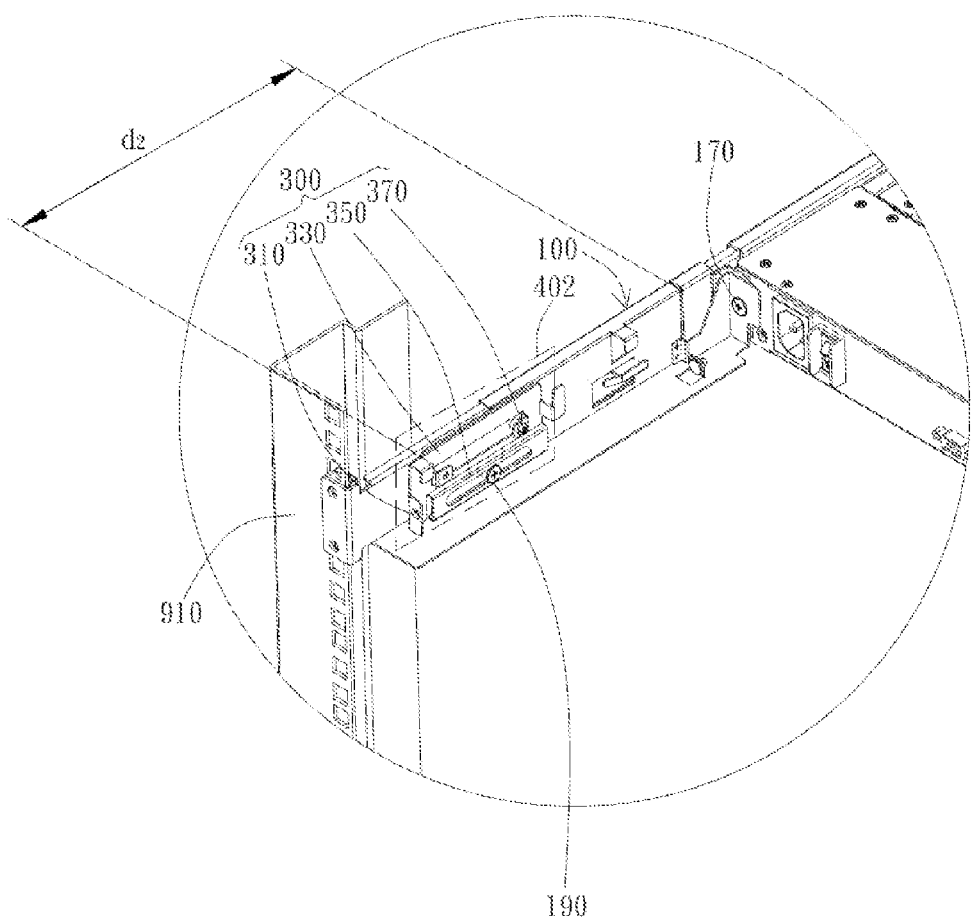
FIGS. 6A and 6B illustrate the mounting structure when the positioning structure is in a second position.
Figure 6B:
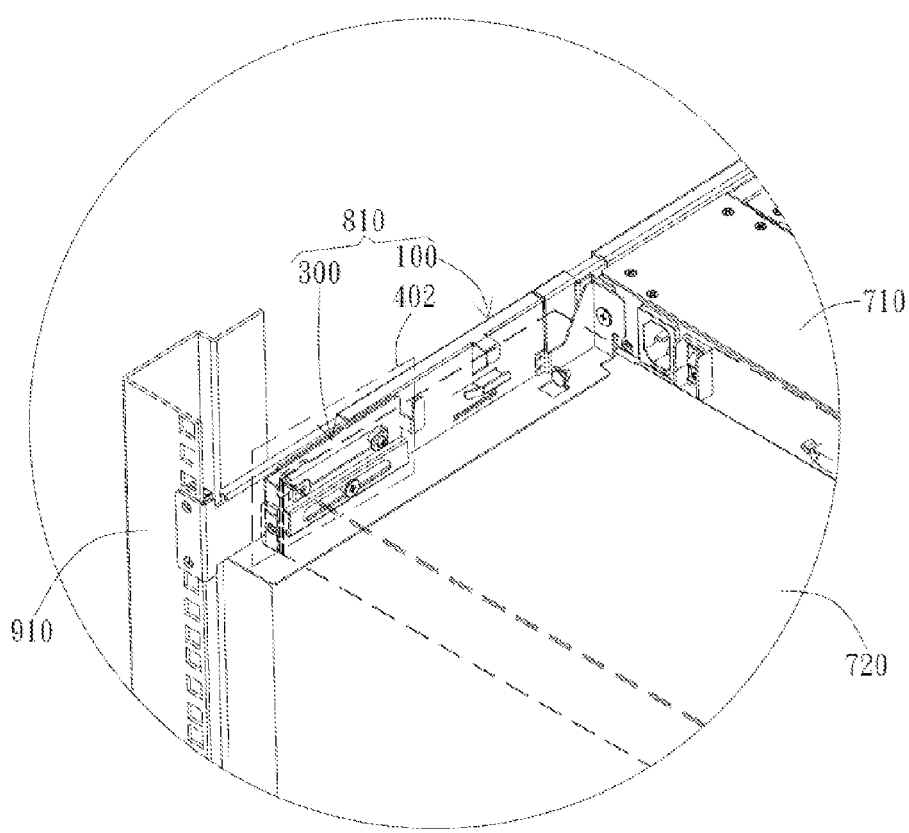
Figure 6C:
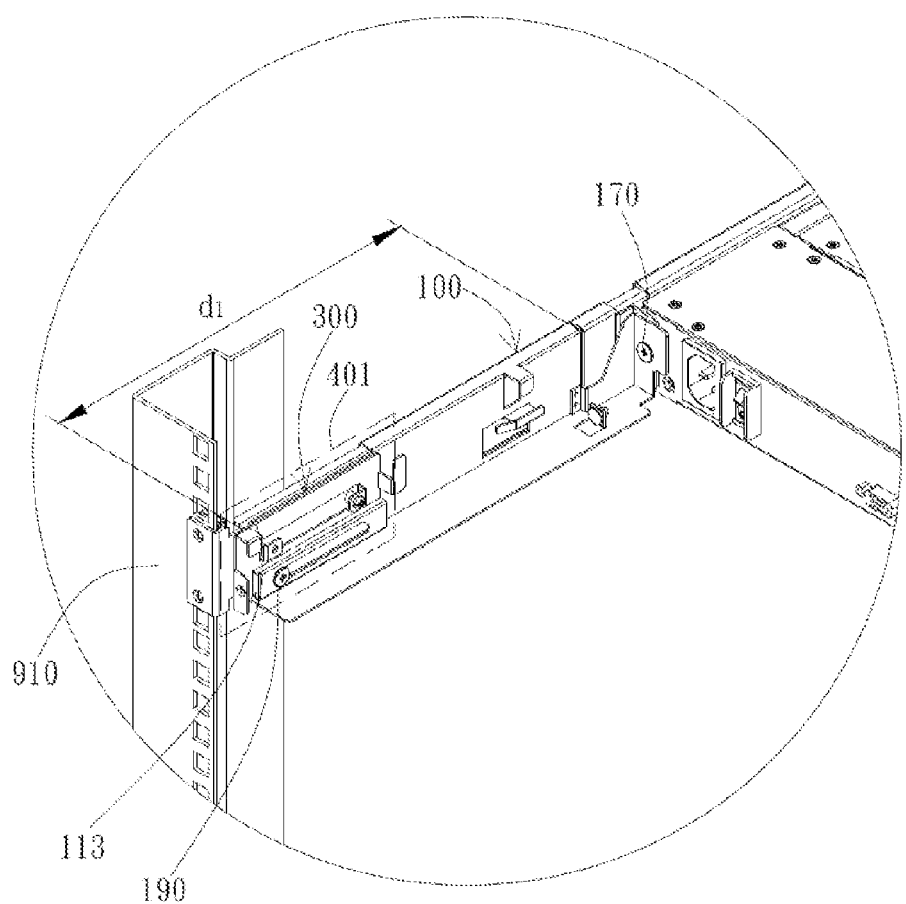
FIGS. 6C and 6D illustrate a portion of the mounting structure according to an alternative embodiment of the present invention.
Figure 6D:
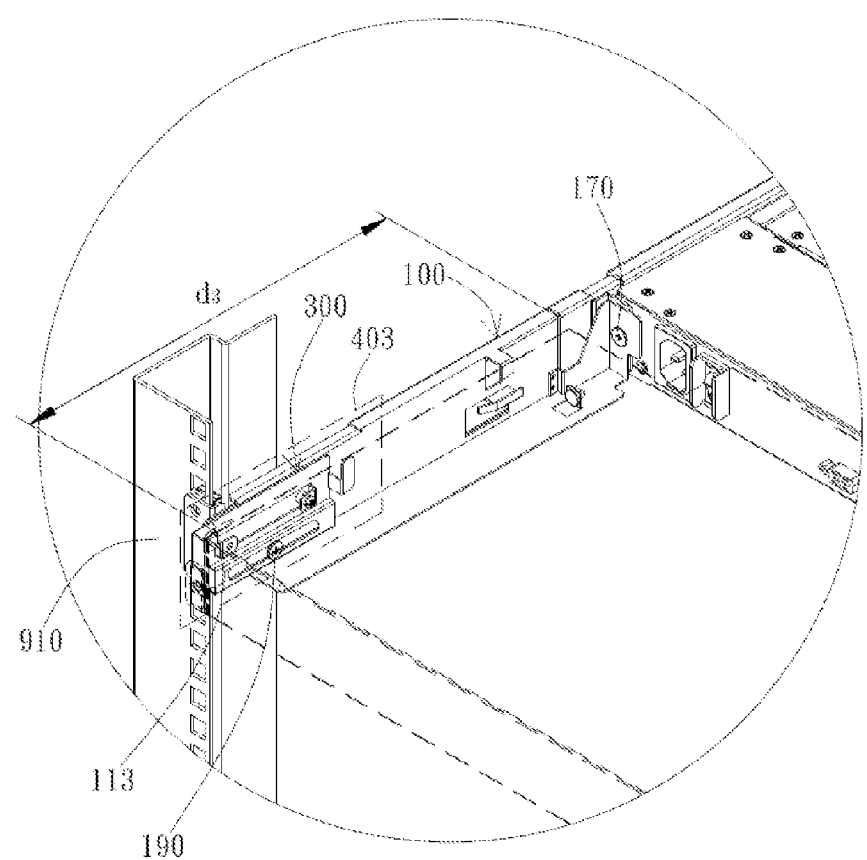

As mentioned earlier, the positioning structure 300 is located at a particular position of the plate 110, such that the mounting structure 810 can have different lengths. Specifically, as shown in FIG. 6A, the affixing structure 100 further includes a guiding member 190, and the positioning structure 300 further includes a positioning plate 330 and locking member 370, where the positioning plate 330 is provided with a guiding slot 350. The guiding member 190 is slidable along the guiding slot 350, and the locking member 370 locks the positioning structure 300 relative to the affixing structure 100. Thus, the guiding slot 350 and the guiding member 190 limits the movement of the positioning structure 300 along the plate 110, and when it is moved to a desired position, the locking member 370 locks positioning structure 300 and the affixing structure 100. When the positioning structure 300 is located at a position 401, the length of the mounting structure 810 is d1, as shown in FIG. 5. When the positioning structure 300 is located at a position 402, the length of the mounting structure 810 is shortened to d2, as shown in FIG. 6A. This way, as shown in FIG. 6B, when the length of the second piece of equipment 720 is relatively small, the second piece of equipment 720 still can be fixedly connected to the positioning structure 300. In other words, the position of the positioning structure 300 relative to the plate 110 is adjustable, so that the length of the mounting structure 810 can be adjusted according to the size of the second piece of equipment 720, to allow the positioning structure 300 to be connected to the second piece of equipment 720. Here, the size of the second piece of equipment 720 refers to its size in the depth direction of the rack. In general, in this disclosure, the terms size, length, and depth are used interchangeably or in different context but they all refer to the dimension in the depth direction of the rack.

As shown in FIGS. 5 to 6B, the length of the mounting structure 810 can be shortened from the length d1 shown in FIG. 5 to the length d2 shown in FIG. 6A, so as to connect a shorted second piece of equipment 720 as shown in FIG. 6B. In an alternative embodiment shown in FIGS. 6C and 6D, the guiding member 190 is located near the end 113. When the positioning structure 300 is located at a position 403 as shown in FIG. 6D, the length of the mounting structure 810 can be lengthened from d1 as shown in FIG. 6C to d3 as shown in FIG. 6D, so as to accommodate a second piece of equipment 720 having a longer length.

Figure 7A:
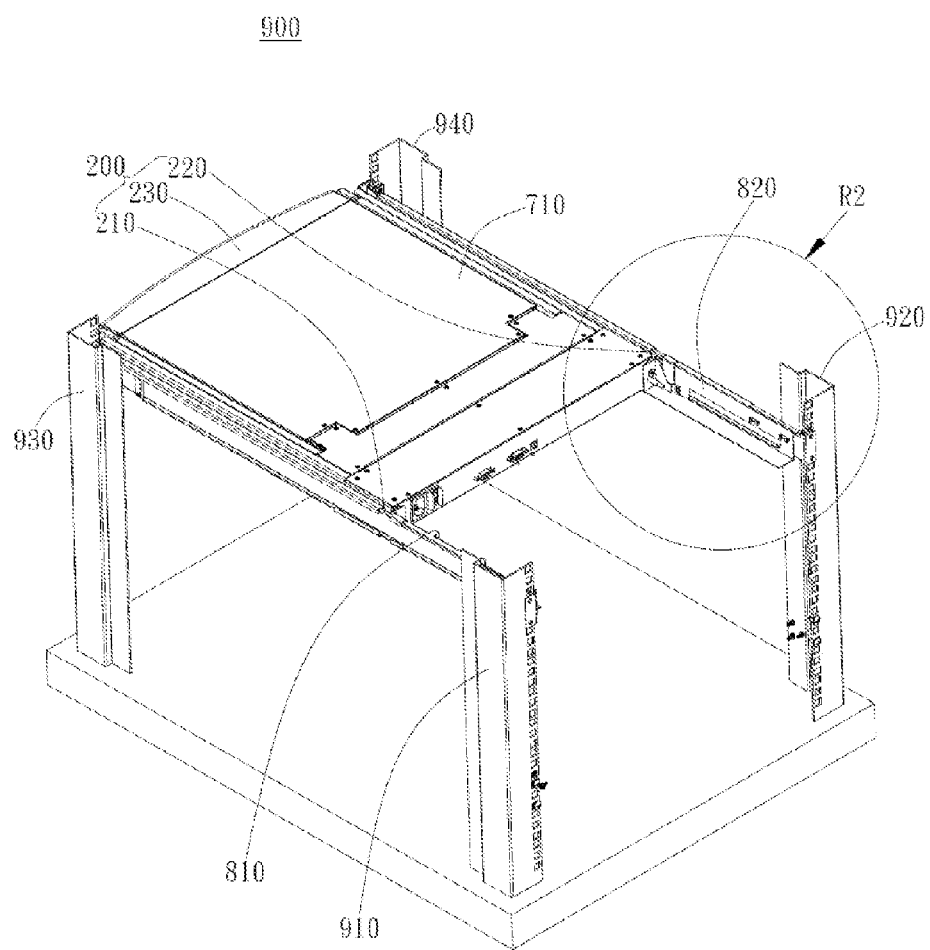
FIG. 7A illustrates the rack and mounting structure with a support structure.
Figure 7B:
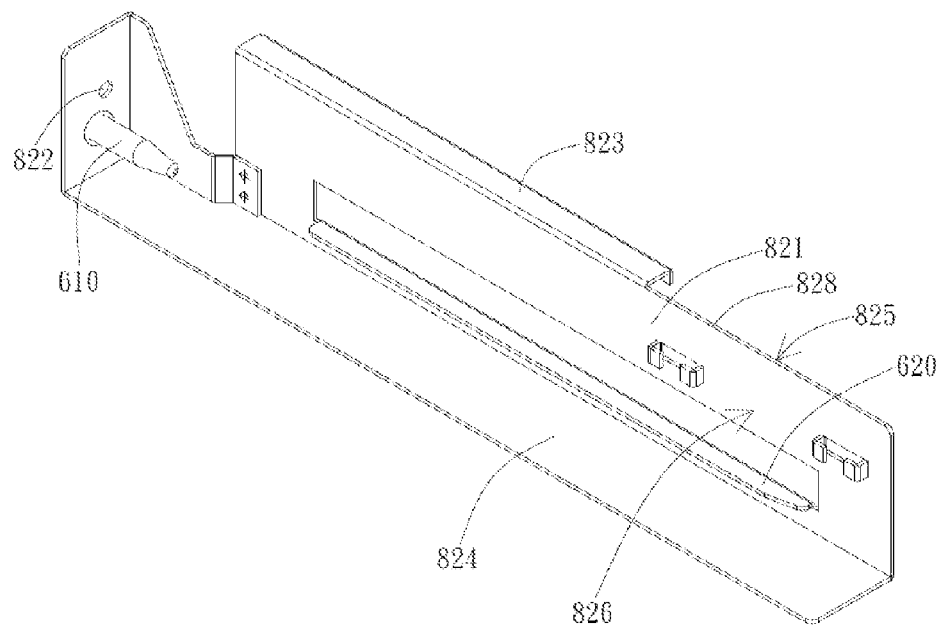
FIG. 7B illustrates details of the support structure.
Figure 7C:
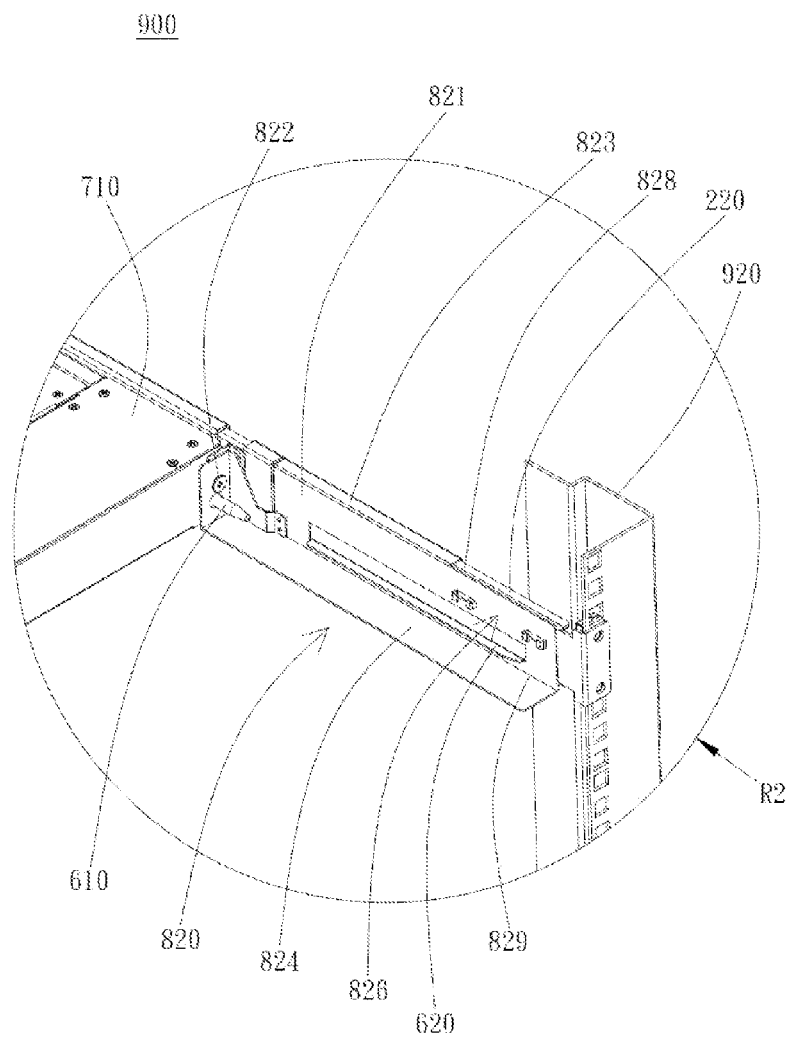
FIG. 7C is an enlarged view of a portion of the support structure shown in FIG. 7A.

As shown in FIG. 7A, the rack 900 preferably includes a support structure 820. As shown in the enlarged view in FIG. 7B, the support structure 820 includes a support plate 821, a third fin 823, a fourth fin 824 and a plate and a support plate mounting member 822. The support plate 820 has a third face 825 and a fourth face 826 opposite the third face 825. In other words, the third face 825 and the fourth face 826 are two opposite sides of the support plate 821. As shown in FIG. 7C, which is an enlarged view of the area R2 in FIG. 7A, the support plate 821 is parallel to the second support arm body 220. The fourth face 826 faces the inside of the U shaped support arm 200 (see FIG. 7A). The support plate mounting member 822 is disposed at one end of the support plate 821, for fixedly connecting the support plate 821 to the first piece of equipment 710. Preferably, the support plate mounting member 822 is provided with a bolt hole to allow a bolt or screw to be screwed into the first piece of equipment 710 to fixedly connect the support plate 821 to the first piece of equipment 710.

The third fin 823 is disposed across the second support arm body 220 along a side face 828 of the support plate 821, and extends in the facing direction of the third face 825. Preferably, the side face 828 of the support plate 821 bends in the facing direction of the third face 825 and extends to form an upside-down flat-bottomed U shape, and the third fin 823 is the top of this upside-down flat-bottomed U shape. When the third fin 823 sits across the second support arm body 220, the top edge of the second support arm body 220 fits into the upside-down flat-bottomed U shape.

The fourth fin 824, which supports the second piece of equipment 720 (see FIG. 2), is disposed along another side face 829 of the support plate 821 that is parallel to the side face 828, and extends in the facing direction of the fourth face 826. More specifically, the fourth fin 824 is a flange formed from the other side face 829 of the support plate 821 extending in the facing direction of the fourth face 826. When the second piece of equipment 720 is coupled to the first piece of equipment 710 (see FIG. 2), the bottom of a side of the second piece of equipment 720 close to the second support arm body 220 is supported by the fourth fin 824.

Figure 8A:
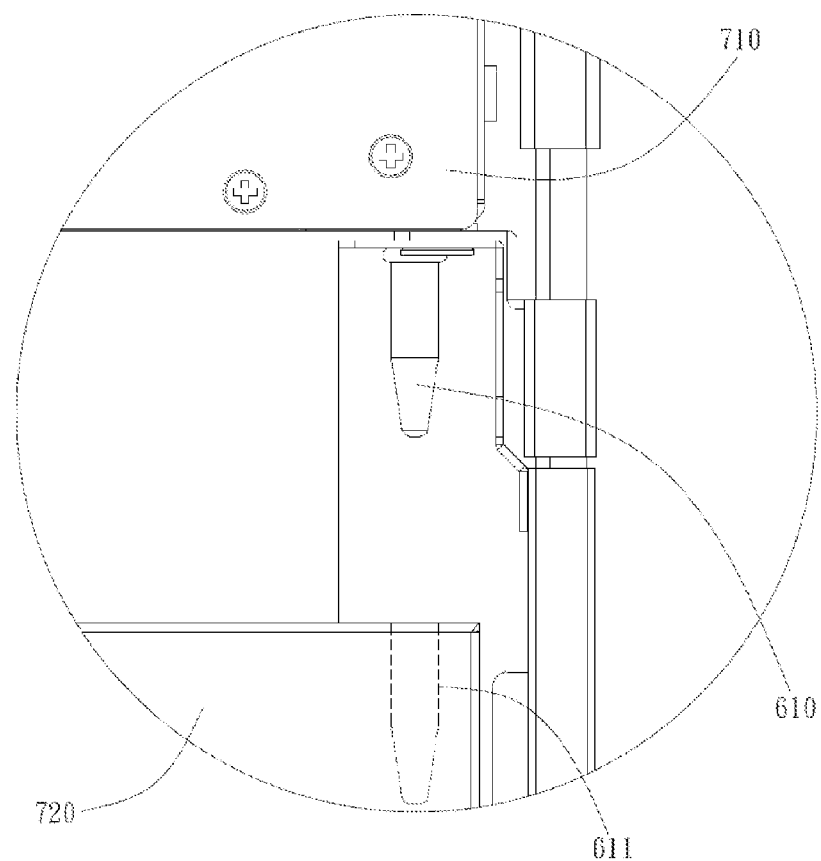
FIG. 8A illustrates a horizontal calibration structure of the rack.

As shown in FIG. 7C, the rack 900 preferably has a horizontal calibration device 610 for calibrating the horizontal positioning of the first and second pieces of equipment 710, 720 as shown in FIG. 8A, to allow a first connector 711 of the first piece of equipment 710 to be connected to a second connector 722 of the second piece of equipment 720. Specifically, the horizontal calibration device 610 may be a pin on an end of the support plate 821 near the first piece of equipment 710, and the second piece of equipment 720 has a corresponding hole 611. When the second piece of equipment 720 is mounted on the rack 900 (see FIG. 2), if the horizontal positions of the first and second pieces of equipment 710 and 720 correctly correspond to each other, the horizontal calibration device 610 can fit into the hole 611, and the first and second connectors 711, 722 can be connected to each other. On the other hand, if the horizontal positions of the first and second pieces of equipment 710 and 720 do not correctly correspond to each other, the horizontal calibration device 610 cannot fit into the hole 611, which will prevent the first and second connectors 711, 722 from being connected to each other. Here, the first and second connectors 711, 722 are preferably directly connected to each other, i.e., one plugs into the other.

Figure 8B:
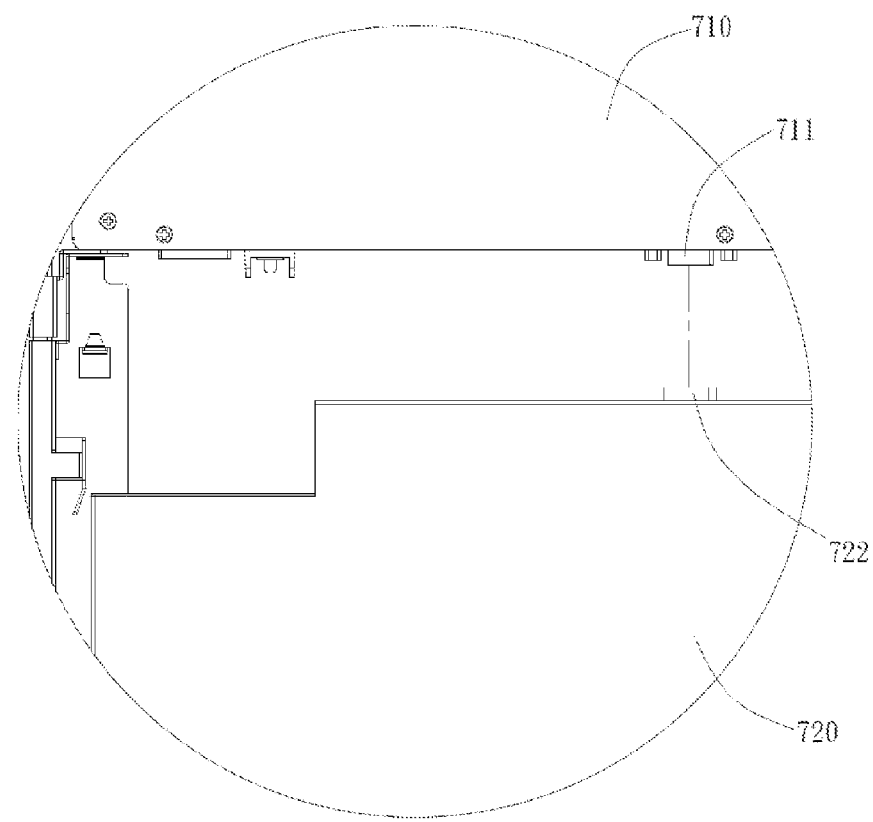
FIG. 8B illustrates first and second connectors of the two pieces equipment for connecting to each other.
Figure 8C:
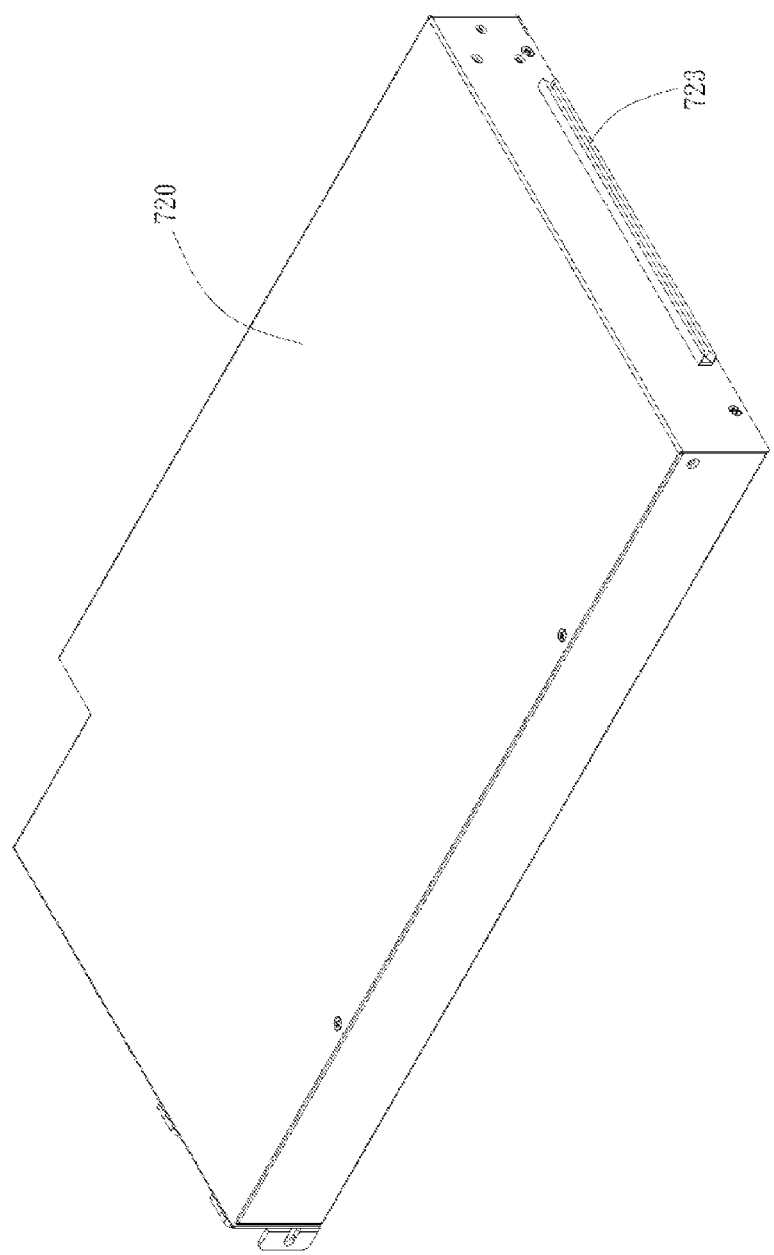
FIG. 8C illustrates a piece of equipment having a groove for vertical calibration.

As shown in FIG. 7C, the rack 900 preferably has a vertical calibration device 620 for calibrating the vertical positioning of the first and second pieces of equipment 710, 720 as shown in FIG. 8B, to allow the first connector 711 to be connected to the second connector 722. Specifically, the vertical calibration device 620 may be a protruding ridge of flange on the support plate 821 formed by punching the support plate 821 toward the facing direction of the fourth face 826. A side of the second piece of equipment 720 has a groove 723 corresponding to the flange 620 as shown in FIG. 8C. When the second piece of equipment 720 is mounted on the rack 900 (see FIG. 2), if the vertical positions of the first and second pieces of equipment 710 and 720 correctly correspond to each other, the vertical calibration device 620 can fit into the groove 723, and the first and second connectors 711, 722 shown in FIG. 8B can be connected to each other. On the other hand, if the vertical positions of the first and second pieces of equipment 710 and 720 do not correctly correspond to each other, the vertical calibration device 620 cannot fit into the groove 723, which will prevent the first and second connectors 711, 722 from being connected to each other.

Overall, the first piece of equipment 710 has the first connector 711 and the second piece of equipment 720 has the second connector 722. When the first connector 711 and the second connector 722 are connected to each other (FIG. 8B), the positioning structure 300 is located at the first position 401 of the plate 110 (FIG. 5), so that the mounting structure 810 has a first length d1. The plate mounting member 170 fixedly connects the affixing structure 100 to the first piece of equipment 710, and equipment mounting member 310 fixedly connects the positioning structure 300 to the second piece of equipment 720. When the size of the second piece of equipment 720 is relatively small, the positioning structure 300 can be located at the position 402 shown in FIG. 6A, to shorten the size of the mounting structure 810 to d2, so that the second piece of equipment 720 is connected to the positioning structure 300 and the first connector 711 is connected to the second connector 722. Meanwhile, to avoid a situation where the first connector 711 and second connector 722 cannot connect to each other due to horizontal or vertical shift of the first and second pieces of equipment 710, 720, horizontal and/or vertical calibration devices are provided to calibrate the horizontal and/or vertical positioning of the first and second pieces of equipment 710, 720.

An advantage of the rack mounting structure according to embodiments of the present invention is that the two pieces of equipment can be connected together by using connectors that directly plug into each other, without using a cable. The adjustable size of the mounting structure enables the two pieces of equipment to be connected in this manner. The horizontal and vertical calibration structure ensures the relative positioning of the two pieces of equipment are correct so that the two connectors on the two pieces of equipment can be directly connected to each other.

It will be apparent to those skilled in the art that various modification and variations can be made in the rack mounting structure of the present invention without departing from the spirit or scope of the invention. Those skilled in the art will appreciate that the embodiments may be implemented by various forms, structures, arrangements, scales, materials, components and assemblies. Thus, it is intended that the present invention cover modifications and variations that come within the scope of the appended claims and their equivalents.

What is claimed is:

1. A rack for mounting a first and a second piece of electronic equipment, comprising:
   a support arm structure on which the first piece of equipment is mounted; and
   a mounting structure, including:
      an affixing structure supported by the support arm structure, having a first mounting member disposed at a first end of the mounting structure adapted for fixedly connecting to the first piece of equipment and a fin for supporting the second piece of equipment, where a bottom surface of the second piece of equipment contacts the fin, and wherein the first mounting member and the fin have a fixed spatial relationship with each other in all directions and are incapable of relative movement with respect to each other; and
      a positioning structure having a second mounting member disposed near a second end of the mounting structure adapted for fixedly connecting to the second piece of equipment, the positioning structure being affixed to the affixing structure at an adjustable position to define an adjustable size of the mounting structure defined by a distance between the first mounting member and the second mounting member; wherein the support arm structure has a first arm and a second arm, the support arm structure being adapted for mounting of the first piece of equipment, wherein the mounting structure is disposed along the first arm, and wherein the rack further comprises a support structure disposed along the second arm, adapted for supporting the second piece of equipment, the support structure including a third mounting member disposed at one end for fixedly connecting to the first piece of equipment.

2. The rack of claim 1,
   wherein the affixing structure further includes a guiding member, and
   wherein the positioning structure further includes:
      a positioning plate having a guiding slot, wherein the guiding member is slidably disposed along the guiding slot, and
      a locking member for locking the positioning structure with respect to the affixing structure.

3. The rack of claim 1, further comprising a horizontal calibration device including a protruding pin which cooperates with a hole in the second piece of equipment to calibrate horizontal positions of the first and second pieces of equipment relative to each other.

4. The rack of claim 1, wherein the mounting structure further includes a vertical calibration device including a protruding ridge which cooperates with a groove in the second piece of equipment to calibrate vertical positions of the first and second pieces of equipment relative to each other.

5. A rack for mounting a first and a second piece of electronic equipment, comprising:
   at least one support post;
   a U shaped support arm, including a first support arm body, an end unit, and a second support arm body, wherein the end unit is adapted for mounting the first piece of equipment; and
   a mounting structure, including:
      an affixing structure, including:
         a plate disposed in parallel with the first support arm body, having a first face and a second face opposite the first face, wherein the second face faces an inside of the U shaped support arm;
         a first fin disposed across the first support arm body along a first side face of the plate and extending in a facing direction of the first face;
         a second fin for supporting the second piece of equipment, disposed along a second side face of the plate parallel to the first side face and extending in a facing direction of the second face, where a bottom surface of the first piece of equipment contacts the second fin; and
         a plate mounting member disposed at a first end of the plate adapted for fixedly connecting to a first piece of equipment, wherein the plate mounting member and the second fin have a fixed spatial relationship with each other in all directions and are incapable of relative movement with respect to each other; and
      a positioning structure disposed at an adjustable position along the affixing structure to define an adjustable size of the mounting structure, the positioning structure including an equipment mounting member located near another end of the plate for fixedly connecting to the second piece of equipment; and wherein the affixing structure further includes a guiding member; wherein the positioning structure further includes: a positioning plate having a guiding slot, wherein the guiding member is slidable along the guiding slot; and a locking member for locking the positioning structure with respect to the affixing structure.

6. The rack of claim 5, further comprising a support structure, including:
   a support plate disposed in parallel with the second support arm body, having a third face and a fourth face opposite the third face, wherein the fourth face faces the inside of the U shaped support arm;

a third fin disposed across the second support arm body along a first side face of the support plate and extending in a facing direction of the third face;

a fourth fin for supporting the second piece of equipment, disposed along a second side face of the support plate parallel to the first side face and extending in a facing direction of the fourth face; and a support plate mounting member disposed at one end of the support plate for fixedly connecting to the first piece of equipment.

7. The rack of claim 5, wherein the first piece of equipment has a first connector and the second piece of equipment has a second connector, wherein when the first connector and the second connector are connected to each other, the positioning structure is disposed at a first position along the affixing structure and the mounting structure has a first size, wherein the plate mounting member fixedly connects the affixing structure to the first piece of equipment and the equipment mounting member fixedly connects the positioning structure to the second piece of equipment.

8. The rack of claim 5, wherein the first piece of equipment has a first connector and the second piece of equipment has a second connector, the rack further comprising a horizontal calibration device for calibrating horizontal positions of the first and second pieces of equipment relative to each other to enable connection of the first connector and the second connector with each other.

9. The rack of claim 5, wherein the first piece of equipment has a first connector and the second piece of equipment has a second connector, the rack further comprising a vertical calibration device for calibrating vertical positions of the first and second pieces of equipment relative to each other to enable connection of the first connector and the second connector with each other.

10. The rack of claim 5, wherein the plate mounting member or the equipment mounting member includes a bore hole.

* * * * *